United States Patent
Lee

[11] Patent Number: 5,981,320
[45] Date of Patent: Nov. 9, 1999

[54] METHOD OF FABRICATING CMOSFET

[75] Inventor: Chang Jae Lee, Chugcheongbuk-Do, Rep. of Korea

[73] Assignee: LG Semicon Co., Ltd., Chungcheongbuk-do, Rep. of Korea

[21] Appl. No.: 08/873,716

[22] Filed: Jun. 12, 1997

[30] Foreign Application Priority Data

Oct. 18, 1996 [KR] Rep. of Korea ..................... 96-46739

[51] Int. Cl.⁶ ............................................. H01L 21/8238
[52] U.S. Cl. ........................... 438/199; 257/369; 438/201
[58] Field of Search ................................... 438/226, 227, 438/225, 228, 230, 231, 232, 233, DIG. 9, 199, 201, 446

[56] References Cited

U.S. PATENT DOCUMENTS 5,830,789  11/1996  Lien et al. ............................... 438/217

OTHER PUBLICATIONS

Tetsuo Hosoya et al., "A Polycide Gate Electrode with a Conductive Diffusion Barrier Formed with ECR Nitrogen Plasma for Dual Gate CMOS ", IEEE Transactions on Electron Devices, vol. 42, No, 12, Dec. 1995, pp. 2111–2116.

*Primary Examiner*—Chandra Chaudhari
*Assistant Examiner*—Scott J. Hawranek
*Attorney, Agent, or Firm*—Morgan, Lewis & Bockius LLP

[57] ABSTRACT

A method of fabricating a CMOSFET includes the steps of selectively forming first and second conductive type wells in a semiconductor substrate, forming an isolation insulating layer at interface of the first and second conductive type wells, forming a first gate electrode formed of a first conductive type electrode over a predetermined area of the second conductive type well and a second gate electrode successively formed of a second conductive type electrode, a diffusion preventing layer, and the first conductive type electrode over a predetermined area of the first conductive type well, forming sidewall spacers on both sides of each of the first and second gate electrodes, forming second and first conductive type impurity regions under surfaces of the first and second conductive type wells, respectively, at both sides of the first and second gate electrodes and the their sidewall spacers, and forming a silicide layer on the first and second gate electrodes and on the semiconductor substrate where the first and second conductive type impurity regions are.

27 Claims, 10 Drawing Sheets

METHOD OF FABRICATING CMOSFET

BACKGROUND OF THE INVENTION

1. Field of the Invention

The present invention relates to a complementary metal oxide semiconductor field effect transistor (CMOSFET) and, more particularly, to a CMOSFET suitable for simplifying its process and improving the reliability of dual gate lines, and method of to fabricating the same.

2. Discussion of the Related Art

Development and research has been directed to reducing a size of a MOSFET constituting integrated circuits in order to obtain good performance of circuits and its high integration. As a result, semiconductor integration circuits have been scaled down to smaller than micron sizes. A width of a gate line in a MOSFET has been narrower, and a parasite capacitance between gate lines is substantially increased due to the increase of wiring voltages and the reduction of a gap between the gate lines caused by the micronization of gate lines, so that the rate of circuits for transmitting signals is considerably reduced. That is, since a delay time which has an influence on the rate of circuits for transmitting signals is indicated by RC which a resistance R of a gate line by a parasite capacitance C between gate lines makes, the resistance R of a gate line is required to be decreased in order to improve a rate of circuits for transmitting signals.

In a method for decreasing a line resistance of a gate electrode, a polycide structure in which silicide is deposited on polysilicon for forming a gate electrode is used instead of a structure in which only polysilicon is used for forming a gate electrode.

As integration of CMOSFETs has been higher, unit devices become smaller in size. An LDD structure is applied to a MOSFET in order to solve the problem of hot carrier which is caused by the short channel effect due to the decrease of the size of unit devices. A gate electrode for a PMOSFET is doped with n-type impurity ions which are identical ones doped into a gate electrode in an N-type MOSFET, such that current doesn't travel between source and drain, but in a bulk inside a substrate. Accordingly, in order to solve the problem of a resulting low punch through breakdown voltage between source and drain, p-type impurity ions are doped into a gate electrode. A CMOSFET produced in this manner is named a dual gate CMOSFET.

In a dual gate CMOSFET, a rate of transmitting signals is decreased as its integration is increased. Accordingly, a structure of a gate using polycide is desired. On account of structural characteristic that silicide is formed on polysilicon so as to form a polycide gate, impurity ions doped into the polysilicon are diffused into the silicide formed on the polysilicon in a process at a high temperature and the impurity ions contained in the silicide are easily diffused. At this time, because of silicide which is known to be diffused more easily than polysilicon, dopants move in the boundary between an n-type gate and a p-type gate, thereby making a threshold voltage of the MOSFET unstable. In order to solve this problem, a method has appeared in which a diffusion-preventing layer is formed at the interface of the silicide and the polysilicon. In the method, a structure of a gate electrode is a silicide structure composed of 3 layers which are silicide/TiN/polysilicon layers.

A conventional CMOSFET using a dual gate will be described below with reference to the accompanying drawings.

FIGS. 1a to 1n are cross-sectional views showing process steps of a conventional method of fabricating a CMOSFET.

Referring initially to FIG. 1a, on an n-type semiconductor substrate 1, there are formed a p-type well 2, an n-type well 3, and a field oxide layer 4.

Subsequently, on the entire surface, there are successively formed a gate oxide layer 5 and an undoped polysilicon layer 6, as shown in FIG. 1b.

Thereafter, a photo resist film $PR_1$ is coated on the entire surface of the polysilicon layer 6 and then patterned by an exposure and development process so that the polysilicon layer 6 is partially exposed, as shown in FIG. 1c. Next, using the photo resist pattern $PR_1$ as a mask, an ion implanting process is performed to turn the undoped polysilicon layer 6 over the p-type well 2 into an n-type polysilicon layer 6a. In this case, phosphorous ions are used.

Then, the remaining photo resist film $PR_1$ is removed as shown in FIG. 1d. Subsequently, another photo resist film PR, is coated on the entire surface of the polysilicon layer 6 including the n-type polysilicon layer 6a and then patterned by an exposure and development process until the polysilicon layer 6 over the n-type well 3 is partially exposed. Using the photo resist pattern $PR_2$ as a mask, an ion-implanting process is performed to turn the undoped polysilicon layer 6 over the n-type well 3 into a p-type polysilicon layer 6b. In this case, boron (B) ions are implanted.

Next, as shown in FIG. 1e, the remaining photo resist film $PR_2$ is removed. Then, a TiN layer 7, which functions as a diffusion preventing layer, and a $WSi_2$ layer 8, which is a first silicide layer, are successively formed on the entire surface of the n-type and p-type polysilicon layers 6a and 6b.

Subsequently, a photo resist film $PR_3$, as shown in FIG. 1f, is coated on the $WSi_2$ layer 8 and then patterned by an exposure and development process so that placements of gate electrodes are defined.

Thereafter, as shown in FIG. 1g, using the photo resist pattern $PR_3$ as a mask, the $WSi_2$ layer 8, the TiN layer 7, and the n-type and p-type polysilicon layers 6a and 6b are selectively removed by an etching process, thus forming a first gate electrode 9 composed of the n-type polysilicon layer 6a, the TiN layer 7, and the $WSi_2$ layer 8 over the p-type well 2, and a second gate electrode 10 composed of the p-type polysilicon layer 6b, the TiN layer 7, and the $WSi_2$ layer 8 over the n-type well 3.

Next, the remaining photo resist film $PR_3$ is removed as shown in FIG. 1h. Still another photo resist film $PR_4$ is coated on the entire surface of the semiconductor substrate 1 including the first and second gate electrodes 9 and 10 and then is patterned by an exposure and development process so that the region of the n-type well 3 is masked. Thereafter, using the first gate electrode 9 over the p-type well 2 as a mask, phosphorous ions are implanted into the p-type well 2 at both sides of the first gate electrode 9.

Subsequently, as shown in FIG. 1i, the remaining photo resist film $PR_4$ is removed. Next, yet another photo resist film $PR_5$ is coated on the entire surface of the semiconductor substrate 1 including the first and second gate electrodes 9 and 10 and then patterned by an exposure and development process so that the region of the p-type well 2 is masked. Using the second gate electrode 10 over the n-type well 3 as a mask, boron ions are implanted into the n-type well 3 at both sides of the second gate electrode 10.

As shown in FIG. 1j, the remaining photo resist film $PR_5$ is removed. Impurity ions implanted into the p-type and n-type wells 2 and 3 are activated to form n-type lightly doped impurity diffusion regions 11 under the surface of the p-type well 2 at both sides of the first gate electrode 9 and p-type lightly doped impurity diffusion regions 12 under the surface of the n-type well 3 at both sides of the second gate electrode 10. That is to say, lightly doped drain (LDD) regions are formed under the surface of each of the wells 2 and 3 at both sides of each of the gate electrodes 9 and 10. Thereafter, an oxide layer is deposited on the entire surface of the substrate including the first and second gate electrodes 9 and 10 and then is etched-back to form sidewall spacers 13 on both sides of each of the first and second gate electrodes 9 and 10.

Next, as shown in FIG. 1*k*, another photo resist film $PR_6$ is coated on the entire surface of the semiconductor substrate 1 including the first and second gate electrodes 9 and 10 and then patterned by an exposure and development process so that the n-type well 3 is masked. Subsequently, using the first gate electrode 9 and its sidewall spacers 13 as masks, an arsenic (As) ion implanting process is executed to the exposed p-type well 2.

As shown in FIG. 1*l*, the remaining photo resist film $PR_6$ is removed. Then, still another photo resist film $PR_7$ is coated on the entire surface of the semiconductor substrate 1 including the first and second gate electrodes 9 and 10 and then patterned by an exposure and development process so that the region of the p-type well 2 is masked. Next, using the second gate electrode 10 and its sidewall spacers 13 as masks, $BF_2$ ions are implanted into the exposed n-type well 3.

Subsequently, the remaining photo resist film $PH_7$ is removed as shown in FIG. 1*m*. The As ions and the $BF_2$ ions doped into the p-type and n-type wells 2 and 3, respectively, are activated to form n-type heavily doped impurity diffusion regions 14 under the surface of the p-type well 2 at both sides of the first gate electrode 9 and its sidewall spacers 13, and p-type heavily doped impurity diffusion regions 15 under the surface of the n-type well 3 at both sides of the second gate electrode 10 and its sidewall spacers 13. That is to say, heavily doped source/drain regions are formed. Thereafter, a titanium (Ti) layer 16 is formed on the entire surface of the substrate including the first and second gate electrodes 9 and 10 and their sidewall spacers 13 for performing a silicide process.

Then, as shown in FIG. 1*n*, the semiconductor substrate 1 is annealed to form a $TiSi_2$ layer 17, which is a second silicide layer, at the interface of the heavily doped impurity diffusion regions 14 and 15 and the Ti layer 16. Next, the Ti layer 16 that has not been reacted is removed.

The conventional method of fabricating a CMOSFET using a dual gate has the following problems.

First, an ion implanting process should be performed to each of polysilicon layers which are used as n-type and p-type gate electrodes and additionally lots of masking processes using photo resist films should be performed. Accordingly, the overall fabricating process becomes complicated and its productivity is decreased.

Second, although impurity ions are implanted to a polysilicon layers in order to decrease a resistance of a gate electrode, a simple ion implanting process can not achieve uniform impurity diffusion concentration of the impurity ions over the polysilicon, and thus a resistance of the gate electrode may be increased. As a result, the performance of a transistor becomes inferior and thus the reliability of highly integrated devices is decreased.

Third, in order to form a silicide layer on gate electrodes and on source/drain regions, a $WSi_2$ layer, a first silicide layer, is formed on the gate electrodes, and a $TiSi_2$ layer, a second silicide layer, is formed on the source/drain regions.

That is, two processes should be performed to form the silicide layer, whereby the productivity is decreased.

SUMMARY OF THE INVENTION

Therefore, the present invention is directed to a CMOSFET and a fabricating method thereof that substantially obviates one or more of problems due to limitations and disadvantages of the related art.

An object of the invention is to provide a CMOSFET and fabricating method thereof in which the formation of a silicide layer on gate electrodes and on source/drain regions is achieved by one sequence of process and masking processes using photo resist films are simplified.

Another object of the invention is to provide a CMOSFET and fabricating method thereof in which doped polysilicon is used to form gate electrodes that have a uniform concentration.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the CMOSFET of the invention includes a semiconductor substrate where first and second conductive type wells are formed, an isolation insulating layer formed at interface of the first and second conductive type wells, a first gate electrode formed of a first conductive type electrode formed over a predetermined area of the second conductive type well, a second gate electrode formed of a second conductive type electrode, a diffusion preventing layer, and the first conductive type electrode successively formed over a predetermined area of the first conductive type well, sidewall spacers formed on both sides of each of the first and second gate electrodes, first conductive type impurity regions formed under a surface of the second conductive type well at both sides of the first gate electrode, second conductive type impurity regions formed under a surface of the first conductive type well at both sides of the second gate electrode, and a silicide layer formed on the first and second gate electrodes and on the semiconductor substrate where the first and second conductive type impurity regions are formed.

In another aspect of the invention, a method of fabricating a CMOSFET having the aforementioned structure includes the steps of selectively forming first and second conductive type wells on a semiconductor substrate, forming an isolation insulating layer at interface of the first and second conductive type wells, forming a first gate electrode formed of a first conductive type electrode over a predetermined area of the second conductive type well and a second gate electrode successively formed of a second conductive type electrode, a diffusion preventing layer, and a first conductive type electrode over a predetermined area of the first conductive type well, forming sidewall spacers on both sides of each of the first and second gate electrodes, forming second and first conductive type impurity regions under surfaces of the first and second conductive type wells, respectively, at both sides of the first and second gate electrodes and the their sidewall spacers, and forming a silicide layer on the first and second gate electrodes and on the semiconductor substrate where the first and second conductive type impurity regions are.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1A:
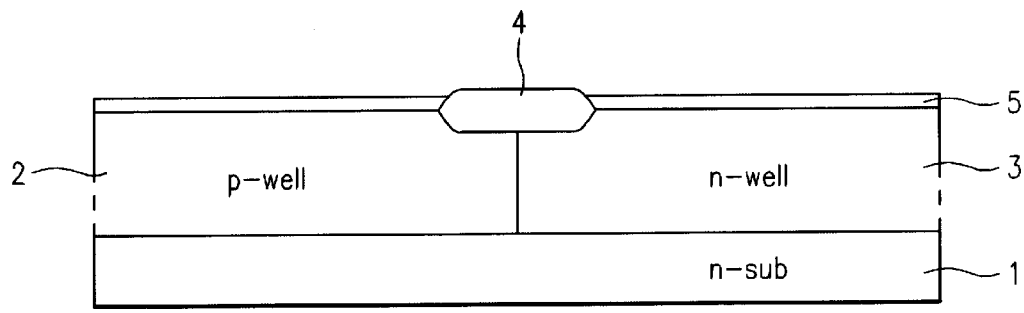
FIGS. 1a to 1n are cross-sectional views showing process steps of a conventional method of fabricating a CMOSFET.
Figure 1B:
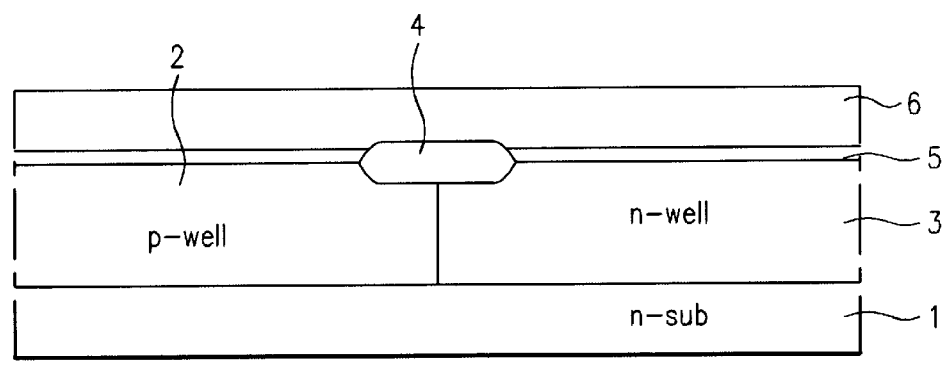
Figure 1C:
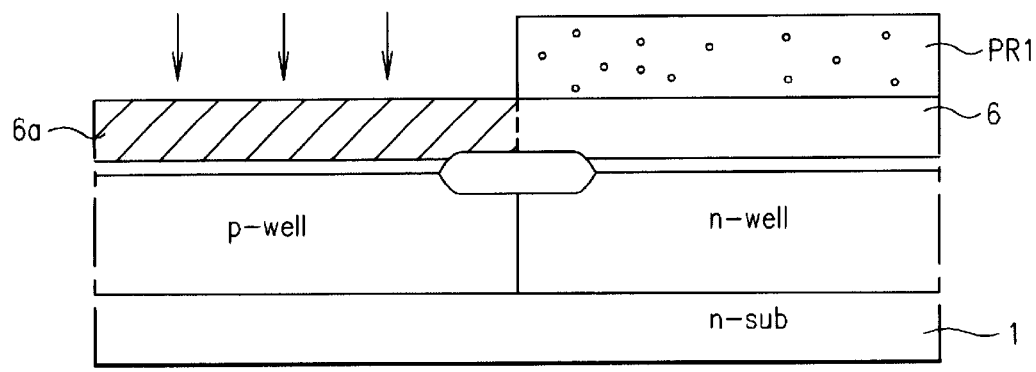
Figure 1D:
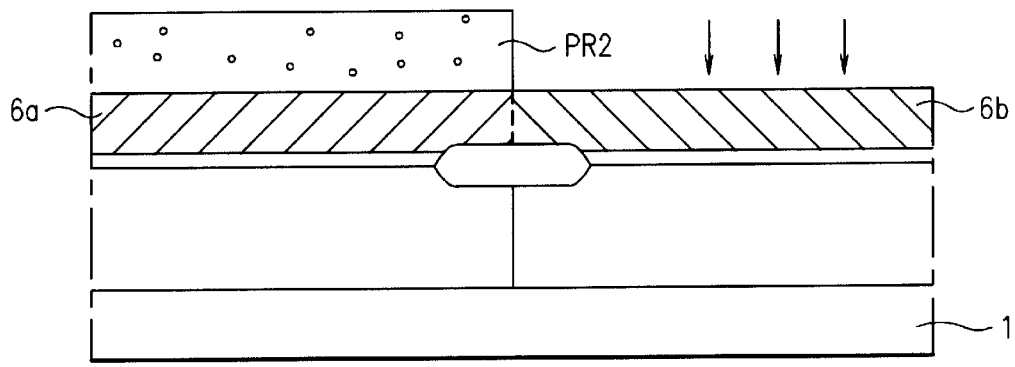
Figure 1E:
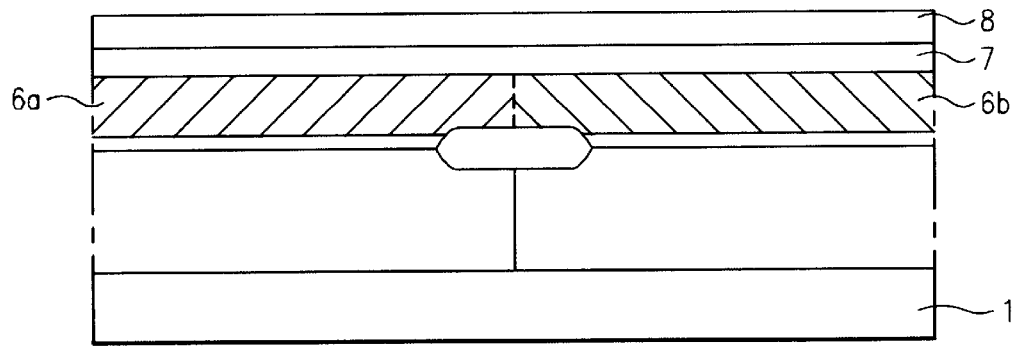
Figure 1F:
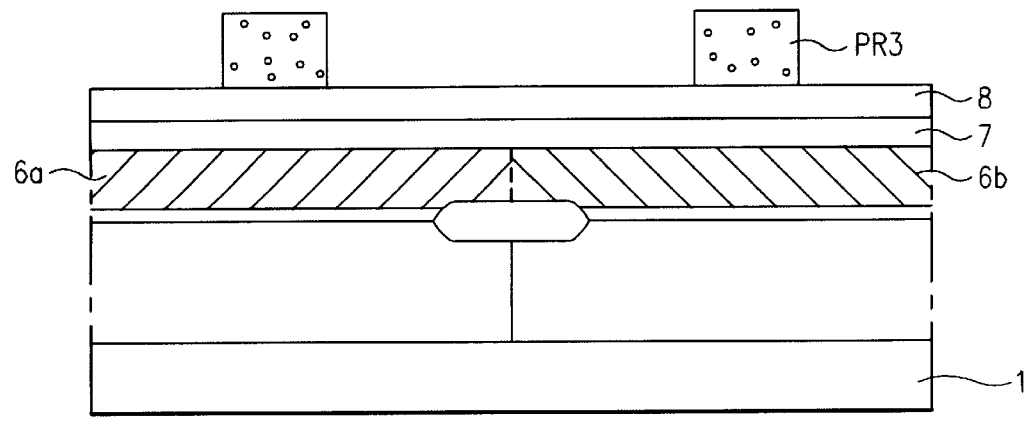
Figure 1G:
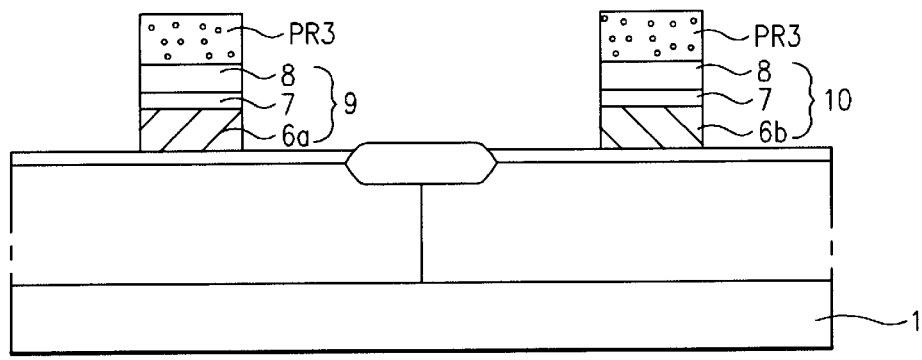
Figure 1H:
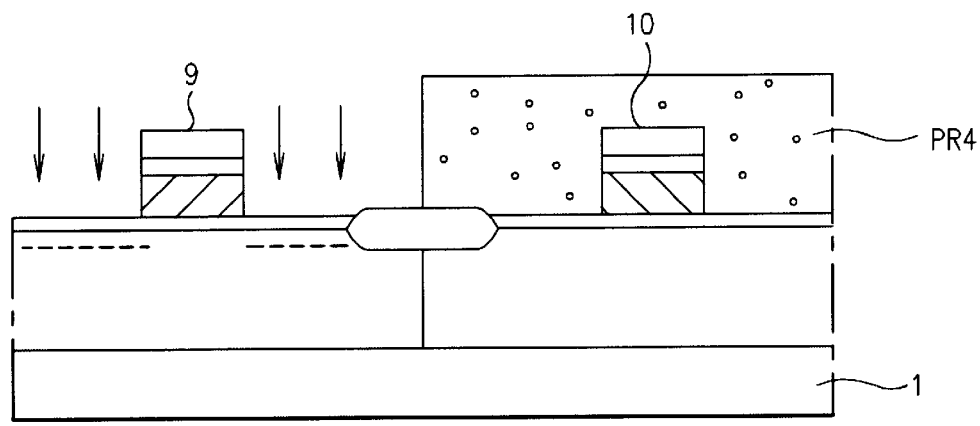
Figure 1I:
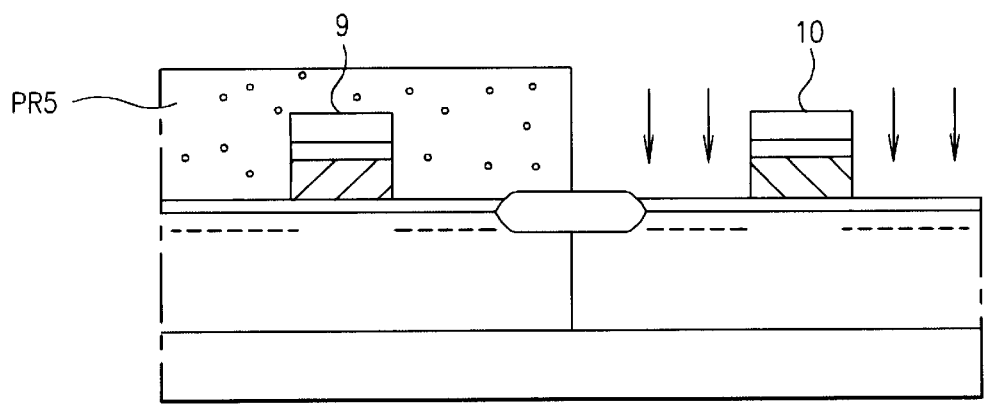
Figure 1J:
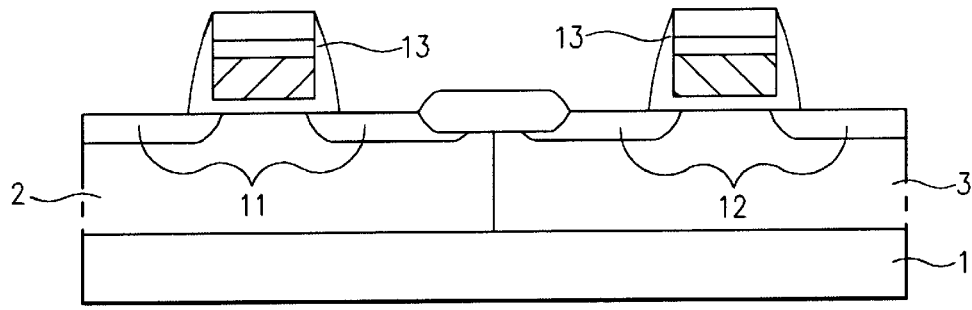
Figure 1K:
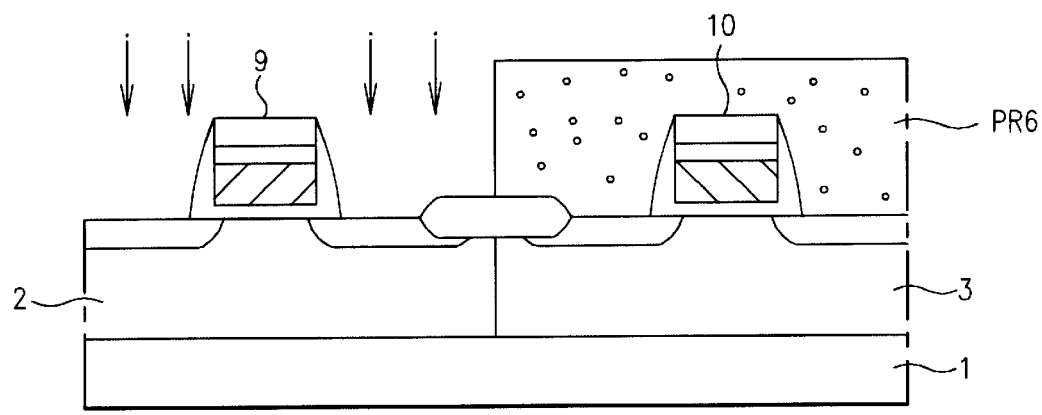
Figure 1L:
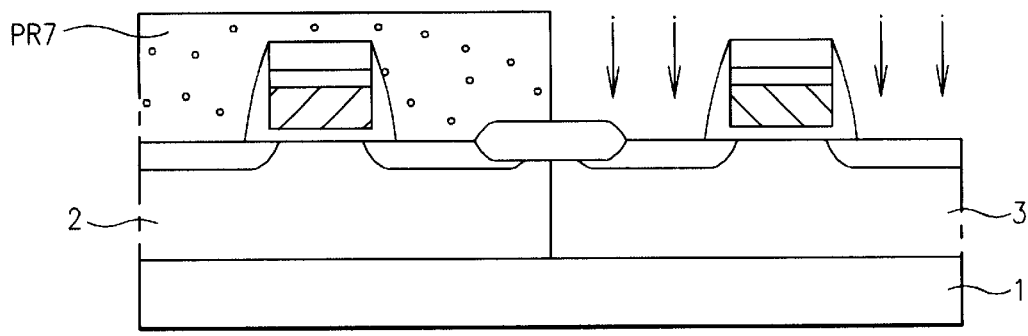
Figure 1M:
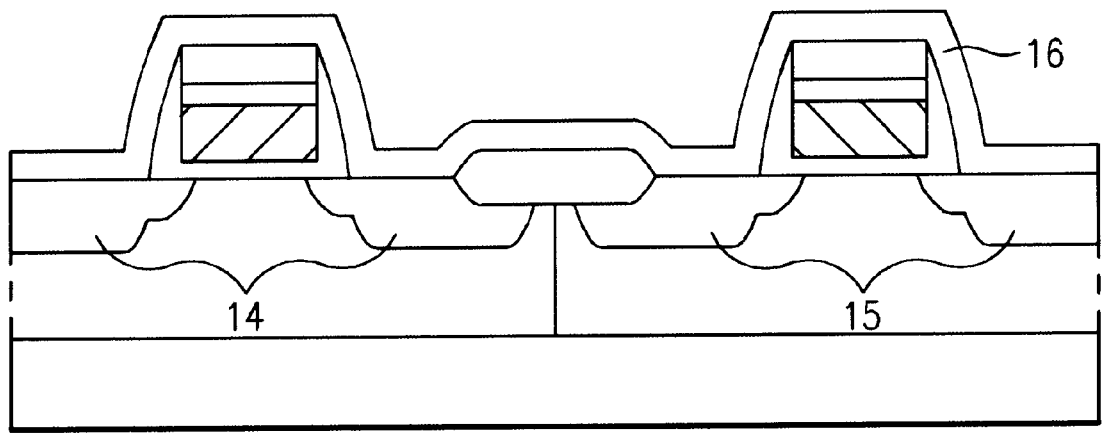
Figure 1N:
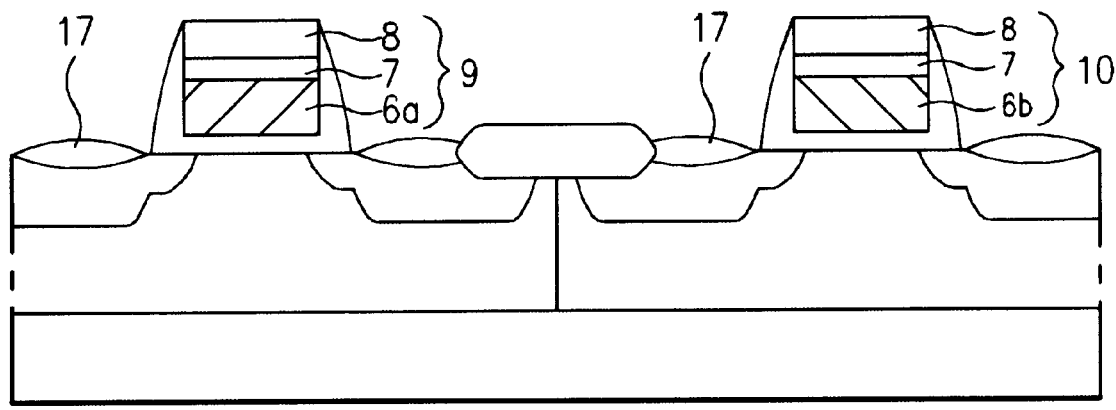
Figure 2:
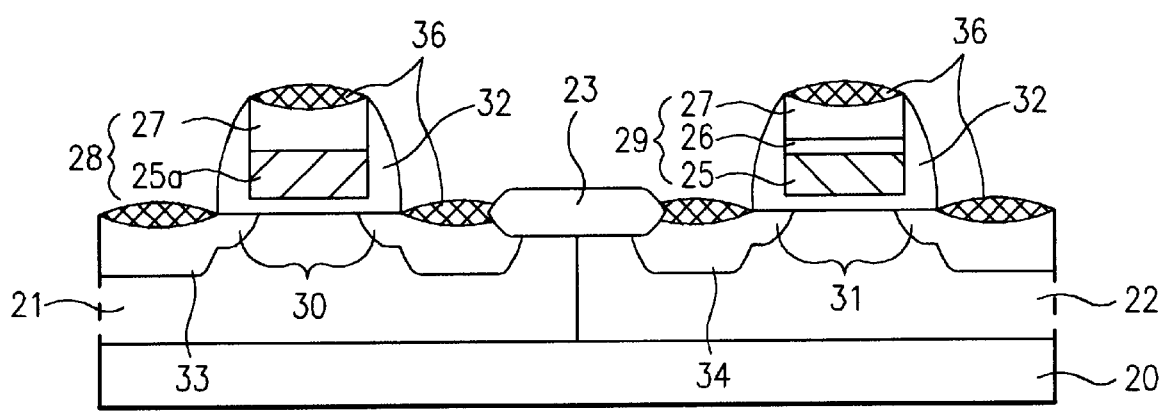
FIG. 2 is a cross-sectional view showing a structure of a CMOSFET according to the present invention.

FIG. 2 is a cross-sectional view showing a structure of a CMOSFET according to the present invention.

As shown in FIG. 2, p-type and n-type wells 21 and 22 are partially formed on an n-type semiconductor substrate 20. An isolation insulating layer 23 is formed at interface of the P-type and n-type wells 21 and 22. Over a predetermined area of the p-type well 21, there is formed a first gate electrode 28 composed of first and second n-type polysilicon layers 25a and 27. Over a predetermined area of the n-type well 22, there is formed a second gate electrode 29 composed of a p-type doped polysilicon layer 25, a diffusion preventing layer 26, and a second n-type polysilicon layer 27 which are successively formed. Sidewall spacers 32 are formed on both sides of each of the first and second gate electrodes 28 and 29. N-type lightly doped impurity regions 30 and n-type heavily doped impurity regions 33, which have a lightly doped drain (LDD) structure, are formed under the surface of the p-type well 21 at both sides of the first gate electrode 28. P-type lightly doped impurity regions 31 and p-type heavily doped impurity regions 34 are formed under a surface of the n-type well 22 at both sides of the second gate electrode 29. A silicide layer 36 is formed on the first and second gate electrodes 28 and 29 and on the semiconductor substrate 20 where the n-type and p-type heavily doped impurity regions 33 and 34 are formed. In this case, a p-type semiconductor substrate can be used instead of the n-type semiconductor substrate 20.

FIGS. 3a to 3l are cross-sectional views showing process steps of a CMOSFET according to a preferred embodiment of the invention.

Figure 3A:
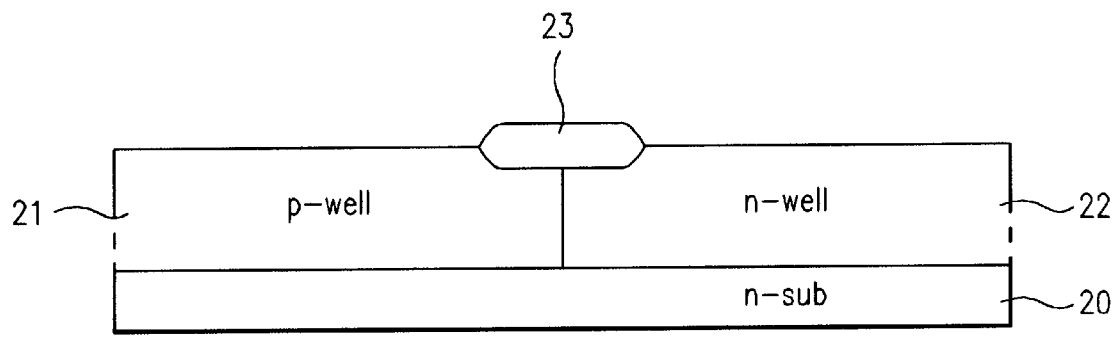
FIGS. 3a to 3l are cross-sectional views showing process steps of a method of fabricating a CMOSFET according to a preferred embodiment of the present invention.

Referring initially to FIG. 3a, a p-type well 21 and an n-type well 22 are formed on an n-type semiconductor substrate 20. Then, an isolation insulating layer 23 is formed at interface of the p-type and n-type wells 21 and 22. At this time, a p-type semiconductor substrate can be used instead of the n-type semiconductor substrate 20. The isolation insulating layer 23 is made of either an oxide or a nitride.

Figure 3B:
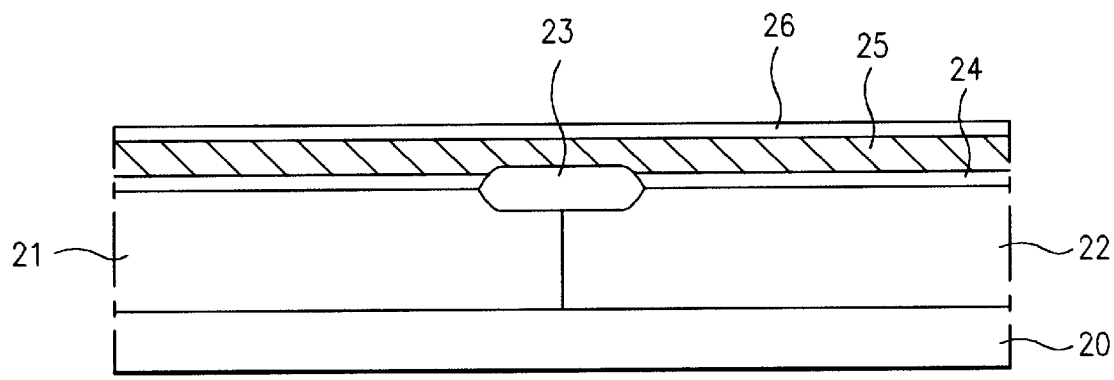

Referring to FIG. 3b, a gate oxide layer 24, a doped polysilicon layer 25, and a diffusion preventing layer 26 are successively formed on the entire surface of semiconductor substrate 20 including the isolation insulating layer 23. The doped polysilicon layer 25 is a boron doped polysilicon layer having a thickness of 100–500 Angstroms, and is a p-type. TiN is sputtered to form the diffusion preventing layer 26 having a thickness of 100–500 Angstroms.

Figure 3C:
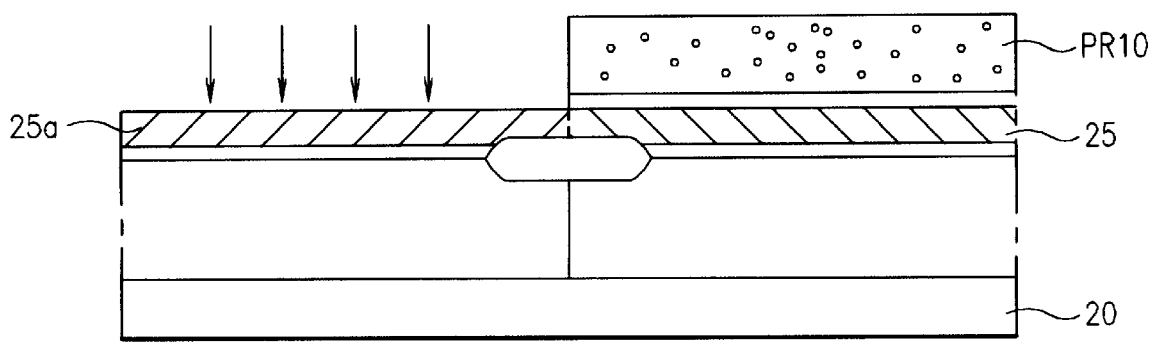

Referring to FIG. 3c, a photo resist film $PR_{10}$ is coated on the entire surface of the diffusion preventing layer 26 and then pattered by an exposure and development process so that the diffusion preventing layer 26 is exposed. Next, the exposed diffusion preventing layer 26 over the p-type well 21 is partially removed. Either phosphorus (P) ions or arsenic (As) ions are implanted into the exposed doped polysilicon layer 25 over the p-type well 21 to turn the doped polysilicon layer 25 into an n-type first polysilicon layer 25a. In this case, a doping concentration of P ions or As ions is $5\times10^{14}/cm^2$–$5\times10^{15}/cm^2$ and the implantation energy is 20–50 KeV. However, the ion implanting process of P or As can be omitted.

Figure 3D:
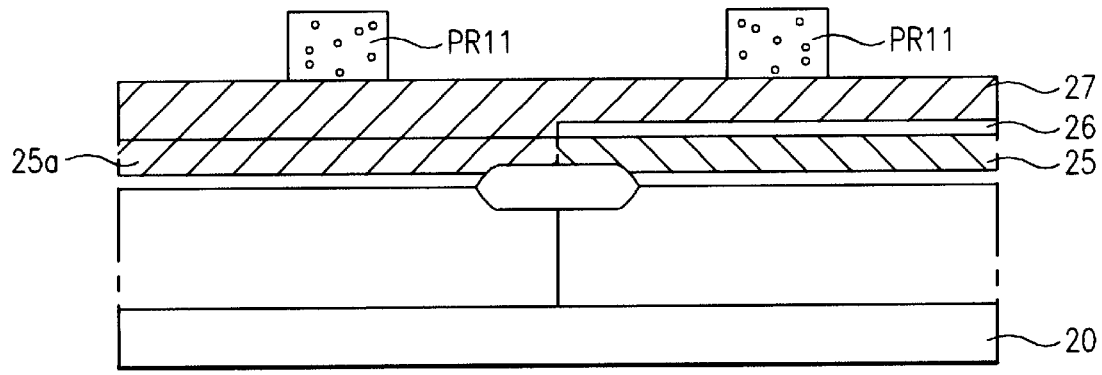

Referring to FIG. 3d, the remaining photo resist film $PR_{10}$ is removed. Next, an n-type second polysilicon layer 27 is formed on the entire surface of the n-type first polysilicon layer 25a and the diffusion preventing layer 26. Then, another photo resist film $PR_{11}$ is coated on the n-type second polysilicon layer 27 and then patterned by an exposure and development process so that a placement of a gate electrode is defined over each of the p-type and n-type wells 21 and 22.

Figure 3E:
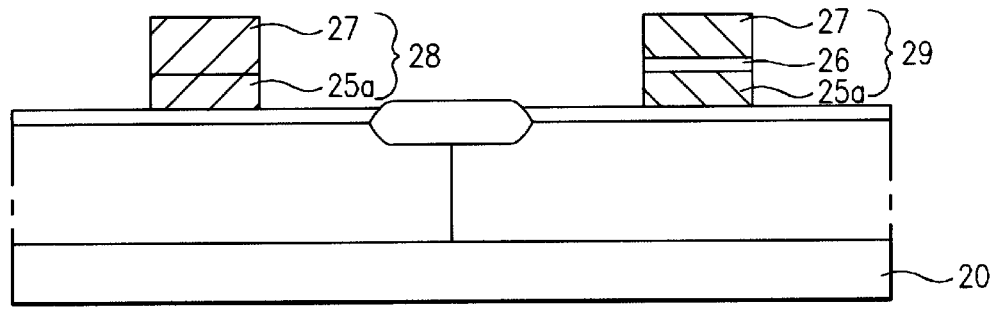

Referring to FIG. 3e, using the photo resist pattern $PR_{11}$ as a mask, the n-type second polysilicon layer 27 and the n-type first polysilicon layer 25a over the p-type well 21 are selectively removed to form a first gate electrode 28, and the n-type second polysilicon layer 27, the diffusion preventing layer 26, and the p-type doped polysilicon layer 25 over the n-type well 22 are selectively removed to form a second gate electrode 29. Subsequently, the remaining photo resist film $PR_{11}$ is removed.

Figure 3F:
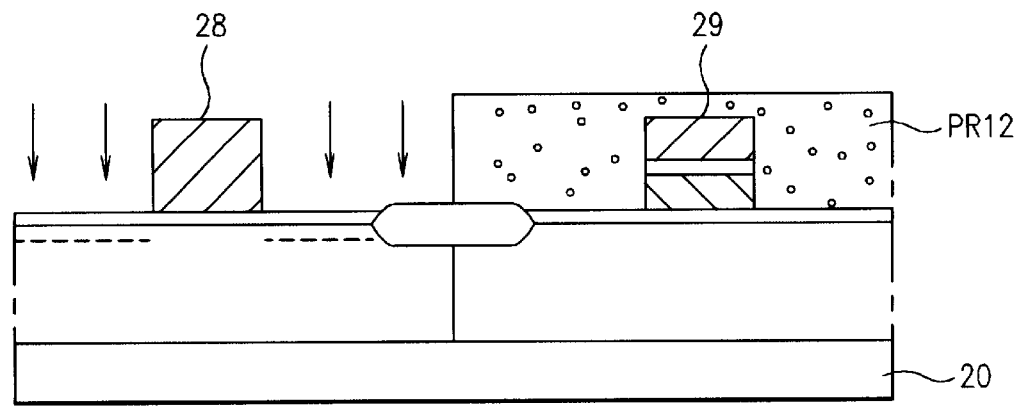

Referring to FIG. 3f, a photo resist film $PR_{12}$ is coated on the entire surface of the substrate including the first and second gate electrodes 28 and 29 and then patterned by an exposure and development process so that only the region of the n-type well 22 is masked. Next, using the first gate electrode 28 over the p-type well 21 as a mask, P ions are implanted into the p-type well 21 at both sides of the first gate electrode 28.

Figure 3G:
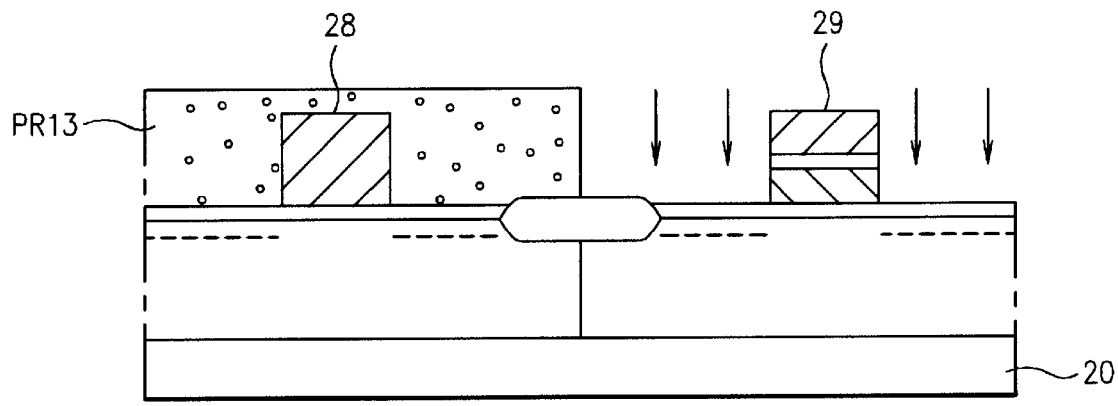

Referring to FIG. 3g, the remaining photo resist film $PR_{12}$ is removed. Still another photo resist film $PR_{13}$ is coated on the semiconductor substrate 20 including the first and second gate electrodes 28 and 29 so that only the region of the p-type well 21 is masked. Using the second gate electrode 29 over the n-type well 22 as a mask, B ions are implanted into the n-type well 22 at both sides of the second gate electrode 29.

Figure 3H:
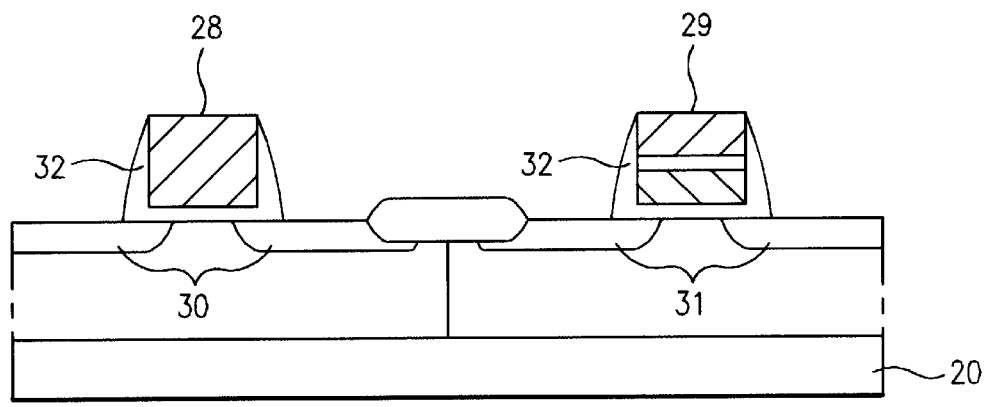

Referring to FIG. 3h, the remaining photo resist film $PR_{13}$ is removed. Next, the doped B ions and P ions are activated to form n-type lightly doped impurity regions 30 under the surface of the p-type well 21 at both sides of the first gate electrode 28, and p-type lightly doped impurity regions 31 under the surface of the n-type well 22 at both sides of the second gate electrode 29. That is, impurity regions having an LDD structure are formed under the surfaces of the p-type and n-type wells 21 and 22. Thereafter, an insulating layer is formed on the entire surface of the substrate including the first and second gate electrodes 28 and 29 and then is etched-back to form sidewall spacers 32 on both sides of each of the first and second gate electrodes 28 and 29.

Figure 3I:
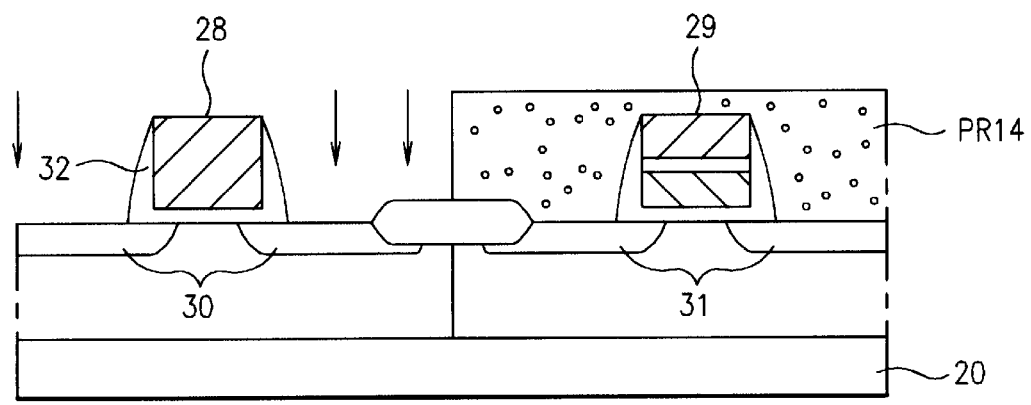

Referring to FIG. 3i, a photo resist film $PR_{14}$ is coated on the entire surface of the semiconductor substrate 20 including the first and second gate electrodes 28 and 29 and then is patterned by an exposure and development process so that the region of the n-type well 22 is masked. Using the first gate electrode 28 and its sidewall spacers 32 as masks, As ions are implanted into the exposed p-type well 21.

Figure 3J:
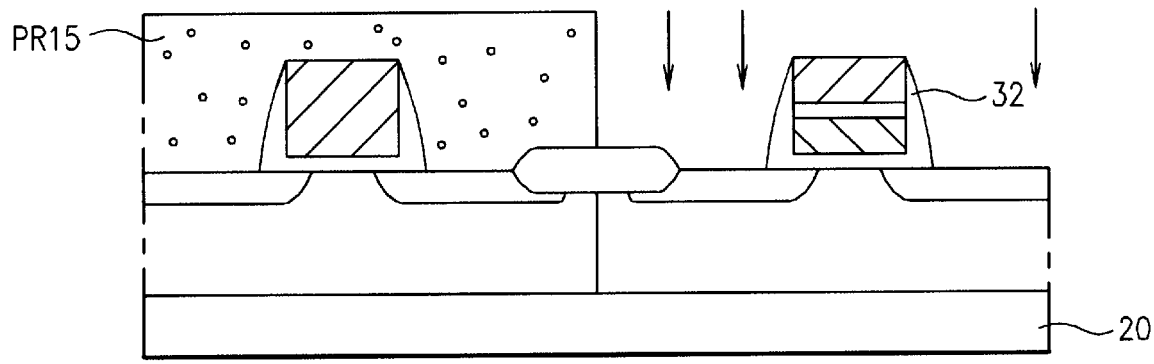

Referring to FIG. 3j, the remaining photo resist film $PR_{14}$ is removed. Then, another photo resist film $PR_{15}$ is coated on the entire surface of the semiconductor substrate 20 including the first and second gate electrodes 28 and 29 and then is patterned by an exposure and development process so that the region of the p-type well 21 is masked. Using the second gate electrode 29 and its sidewall spacers 32 as masks, $BF_3$ ions are implanted into the exposed n-type well 22.

Figure 3K:
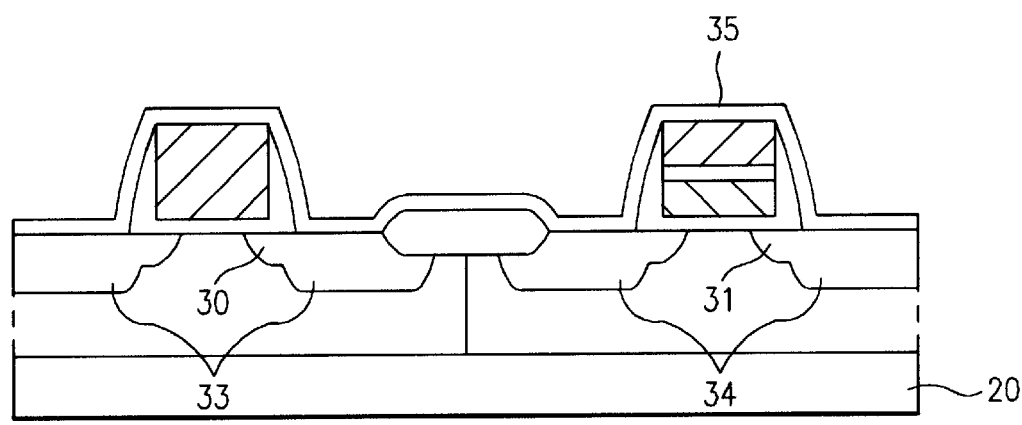

Referring to FIG. 3k, the remaining photo resist film $PR_{15}$ is removed. Next, the As ions and the $BF_2$ ions doped into the p-type and n-type wells 21 and 22, respectively, are activated to form n-type heavily doped impurity regions 33 under the surface of the p-type well 21 at both sides the first gate electrode 28 and its sidewall spacers 32, and p-type heavily doped impurity regions 34 under the surface of the n-type well 22 at both sides of the second gate electrode 29 and its sidewall spacers 32. These impurity regions are used as source and drain regions. Thereafter, a refractory metal 35 is formed on the entire surface of the substrate including the first and second gate electrodes 28 and 29 and their sidewall spacers 32. At this time, the refractory metal 35 is made of titanium (Ti) 35 or cobalt (Co) which enables to form a silicide layer, and is formed with a sputtering process.

Figure 3L:
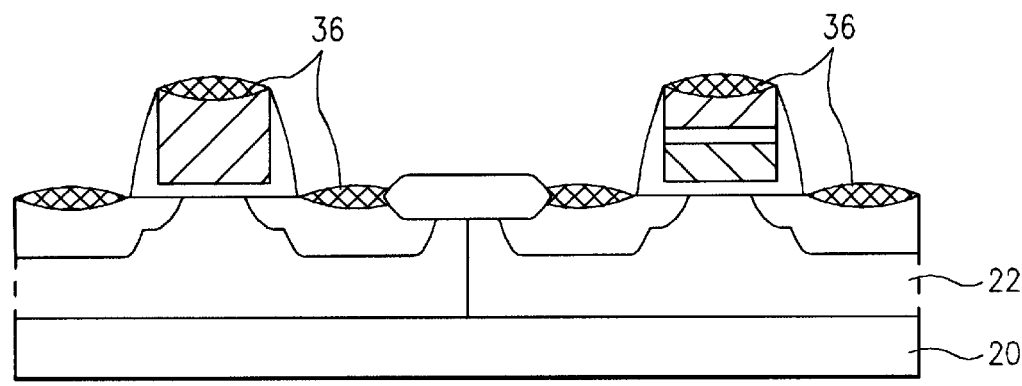

Referring to FIG. 3l, the entire surface of the semiconductor substrate 20 is annealed so that the refractory metal 35 is reacted with the surface of the p-type and n-type well under which the heavily doped impurity regions 33 and 34 are formed and with the top surfaces of the first and second gate electrodes 28 and 29, thus forming a silicide layer 36 such as $CoSi_2$, $TiSi_2$ at their interface. Then, the refractory metal 35 which has not been reacted is removed. In order to form this silicide layer 36, the annealing process is performed at 700° C., in a mood of $N_2$, in rapid thermal processing (RTP), for 10 seconds. Subsequently, another annealing process is preformed at 900° C., in a mood of $N_2$, in (RTP), for 20 seconds. The refractory metal 35 which has not been reacted is dipped into an aqueous solution in which HCl and $H_2O_2$ are mixed, so as to be removed.

The dual gate CMOSFET of the invention has the following advantages.

First, since a doped polysilicon layer is used to form a dual gate electrode of each of p-type and n-type, there are not needed photo lithography processes and ion implanting processes which have to be performed in a conventional method in which etching processes should be performed after implanting ions. As a result, its productivity is improved.

Second, since a doped polysilicon layer, which is formed by an ion implanting process to have a uniform impurity diffusion concentration, is used for a dual gate electrode, performance of a transistor is advanced to decrease a wiring resistance of the gate electrode, thereby providing a semiconductor device suitable for high rate operations.

Finally, since a silicide layer is formed on gate electrodes and source/drain regions in a sequence of process, its overall process is simplified and thus its production yield can be advanced.

It will be apparent to those skilled in the art that various modification and variations can be made in the CMOSFET and method of fabricating the same of the present invention without departing from the spirit or scope of the inventions. Thus, it is intended that the present invention cover the modifications and variations of this invention provided they come within the scope of the appended claims and their equivalents.

What is claimed is:

1. A method of fabricating a CMOSFET, comprising the steps of:

selectively forming first and second conductive type wells in a semiconductor substrate;

forming an isolation insulating layer at interface of the first and second conductive type wells;

forming a first gate electrode formed of a first conductive type electrode over a first area of the second conductive type well and a second gate electrode formed of a second conductive type electrode, a diffusion preventing layer, and the first conductive type electrode over a first area of the first conductive type well;

forming sidewall spacers on both sides of each of the first and second gate electrodes;

forming second and first conductive type impurity regions under surfaces of the first and second conductive type wells, respectively, at both sides of the first and second gate electrodes and the sidewall spacers; and forming a suicide layer on the first and second gate electrodes and on the semiconductor substrate where the first and second conductive type impurity regions are;

wherein the step of forming the first and second gate electrodes further comprises:

forming a gate oxide layer, a second conductive type doped polysilicon layer, and the diffusion preventing layer on the semiconductor substrate where the first and second conductive type wells are formed, selectively removing the diffusion preventing layer over the second conductive type well, implanting first conductive type impurity ions into the second conductive type doped polysilicon layer exposed by the selective removal of the diffusion preventing layer to form a first conductive type first polysilicon layer, forming a first conductive type second polysilicon layer on the entire surface of the diffusion preventing layer including the first conductive type first polysilicon layer, and selectively removing the first conductive type first polysilicon layer and the first conductive type second polysilicon layer over a second area of the second conductive type well so as to form the first gate electrode, and selectively removing the second conductive type doped polysilicon layer, the diffusion preventing layer and the first conductive type polysilicon layer over a second area of the first conductive type well so as to form the second gate electrode.

2. The method as claimed in claim 1, wherein said second conductive type doped polysilicon layer is a polysilicon layer that boron ions are doped into.

3. The method as claimed in claim 2, wherein said boron-doped polysilicon layer is formed to have a thickness of between 500 Angstroms and 1000 Angstroms.

4. The method as claimed in claim 1, wherein said diffusion preventing layer is formed of a nitride having conductivity.

5. The method as claimed in claim 2, wherein said nitride having conductivity is formed of TiN.

6. The method as claimed in claim 1, wherein said diffusion preventing layer is formed with a sputtering process.

7. The method as claimed in claim 1, wherein said diffusion preventing layer is formed to have a thickness of between 100 Angstroms and 500 Angstroms.

8. The method as claimed in claim 1, wherein said first conductive type impurity ions doped into the second doped polysilicon layer over the second conductive type well are either phosphorus ions or arsenic ions.

9. The method as claimed in claim 1, wherein a doping concentration of said first conductive type impurity ions is between $5\times10^{14}/cm^2$ and $5\times10^{15}/cm^2$.

10. The method as claimed in claim 7, wherein said first conductive type impurity ions are implanted by energy of 20 KeV –50 KeV.

11. The method as claimed in claim 2, wherein the process step of implanting the first conductive type impurity ions into the second conductive type doped polysilicon layer exposed by the selective removal of the diffusion preventing layer is omitted and the first conductive type second polysilicon layer is formed on the entire surface of the diffusion preventing layer including the first conductive type first polysilicon layer.

12. The method as claimed in claim 1, wherein the process step of forming the silicide layer comprises the steps of:
    forming a refractory metal on the entire surface of the semiconductor substrate including the first and second gate electrodes and the sidewall spacers;
    annealing the entire surface of the semiconductor substrate including the refractory metal so as to form the silicide layer at interface of the refractory metal and the first and second gate electrodes and at interface of the refractory metal and the first and second conductive type wells; and
    removing the refractory metal which is not reacted to be the silicide layer.

13. The method as claimed in claim 12, wherein said refractory metal is formed of either cobalt (Co) or titanium (Ti).

14. The method as claimed in claim 13, wherein either Co or Ti is sputtered to form the refractory metal.

15. The method as claimed in claim 12, wherein in the process steps of annealing, the annealing is performed in rapid thermal processing (RTP), at 700° C., in a mood of $N_2$, for 10 seconds and then is performed again in RTP, at 900° C., in a mood of $N_2$, for 20 seconds.

16. The method as claimed in claim 12, wherein said refractory metal which is not reacted to be the silicide layer is removed by an aqueous solution in which HCL and $H_2O_2$ are mixed.

17. The method as claimed in claim 12, wherein said silicide layer is formed of either $CoSi_2$ or $TiSi_2$.

18. The method as claimed in claim 1, wherein said semiconductor substrate is either the first conductive type or the second conductive type.

19. A method of fabricating a CMOSFET comprising the steps of:
    forming a first conductive type well and a second conductive type well in a semiconductor substrate;
    forming an isolation layer at an interface of the first and second conductive type wells;
    forming a gate insulating layer over the entire surface of the substrate;
    forming a first gate electrode of first conductive type on the gate insulating layer over the second conductive type well;
    forming a second gate electrode on the gate insulating layer over the first conductive type well, the second gate electrode being formed of a first conductive layer, a diffusion preventing layer on the first conductive layer, and a second conductive layer on the diffusion preventing layer; and
    forming first aid second conductive type impurity regions respectively in the second and first conductive type wells using the first and second gate electrodes, respectively, as masks;
    wherein the steps of forming the first and second gate electrodes further comprise:
        forming a gate oxide layer a second conductive type doped polysilicon layer, and the diffusion preventing layer on the semiconductor substrate where the first and second conductive type wells are formed,
        selectively removing the diffusion preventing layer over the second conductive type well,
        implanting first conductive type impurity ions into the second conductive type doped polysilicon layer exposed by the selective removal of the diffusion preventing layer to form a first conductive type first polysilicon layer,
        forming a first conductive type second polysilicon layer on the entire surface of the diffusion preventing layer including the first conductive type first polysilicon layer, and
        selectively removing the first conductive type first polysilicon layer and the first conductive type second polysilicon layer over an area of the second conductive type well so as to form the first gate electrode, and selectively removing the second conductive type doped polysilicon layer, the diffusion preventing layer, and the first conductive type polysilicon layer over an area of the first conductive type well so as to form the second gate electrode.

20. The method according to claim 19, wherein the first conductive layer in the second gate electrode is the second conductive type doped polysilicon layer, and the first gate electrode and the second conductive layer in the second gate electrode are first conductive type doped polysilicon layers.

21. The method according to claim 19, wherein the diffusion preventing layer is a nitride layer having conductivity.

22. The method according to claim 19, wherein the impurity regions are lightly doped impurity regions.

23. The method according to claim 22, further comprising the steps of:
    forming sidewall spacers at sides of the first and second electrodes; and
    forming first and second conductive type heavily doped impurity regions respectively in the second and first conductive type wells using the first and second gate electrodes, respectively, along with the sidewall spacers as masks.

24. The method according to claim 23, wherein the step of forming sidewall spacers includes the step of:
    forming an insulating layer over the entire surface of the substrate; and
    etching back the insulating layer and portions of the gate insulating layer to expose the top surfaces of the first and second electrodes and the surface of the substrate in the lightly doped impurity regions.

25. The method according to claim 24, further comprising the step of forming suicide layers on the exposed surfaces of the semiconductor substrate and the first and second electrodes.

26. The method according to claim 25, wherein the step of forming silicide layers include the steps of:

forming a refractory metal layer over the entire surface of the substrate;

annealing to cause reaction between the refractory metal layer and the exposed surfaces of the semiconductor substrate and of the first and second electrodes to form the silicide layers at the exposed surfaces of the semiconductor substrate and the first and second electrodes; and removing the refractory metal layer that is not reacted during the annealing step.

27. The method according to claim 26, wherein the step of forming the refractory metal layer includes the step of sputtering titanium or cobalt over the entire surface of the substrate.

* * * * *